United States Patent [19]

Lee et al.

[11] 4,455,567

[45] Jun. 19, 1984

[54] POLYCRYSTALLINE SEMICONDUCTOR RESISTOR HAVING A NOISE REDUCING FIELD PLATE

[75] Inventors: Joseph Y. M. Lee, Agoura; Gary E. Grimm, Los Angeles, both of Calif.

[73] Assignee: Hughes Aircraft Company, Culver City, Calif.

[21] Appl. No.: 325,447

[22] Filed: Nov. 27, 1981

[51] Int. Cl.³ .................... H01L 27/02; H01L 29/40; H01L 29/04
[52] U.S. Cl. ........................................ 357/51; 357/59; 357/53
[58] Field of Search ............. 357/51, 59, 71 S, 23 TF, 357/42, 53, 84

[56] References Cited

U.S. PATENT DOCUMENTS

| | | | |
|---|---|---|---|
| 3,385,731 | 5/1968 | Weimer | 357/23 TF |
| 3,470,610 | 10/1969 | Breitweiser | 357/23 TF |
| 3,500,137 | 4/1970 | Schroen et al. | 357/23 TF |
| 4,040,073 | 8/1977 | Luo | 357/23 TF |
| 4,110,776 | 8/1978 | Rao et al. | 357/59 |
| 4,209,716 | 6/1980 | Raymond, Jr. | 357/71 S |
| 4,225,877 | 9/1980 | Miles et al. | 357/51 |
| 4,234,889 | 11/1980 | Raymond, Jr. et al. | 357/71 S |
| 4,240,097 | 12/1980 | Raymond, Jr. | 357/71 S |
| 4,256,515 | 3/1981 | Miles et al. | 357/51 |
| 4,263,518 | 4/1981 | Ballatore et al. | 357/51 |
| 4,272,880 | 6/1981 | Pashley | 357/42 |
| 4,285,117 | 8/1981 | Heeren | 357/51 |
| 4,377,819 | 3/1983 | Sakai et al. | 357/51 |

FOREIGN PATENT DOCUMENTS

| | | | |
|---|---|---|---|
| 54-128295 | 10/1979 | Japan | 357/51 |
| 55-53452 | 4/1980 | Japan | 357/71 S |

OTHER PUBLICATIONS

Lai-Wang Chen, "Electrical and Noise Properties of Vacuum Deposited Thin Germanium Films" PhD Thesis, University of South Florida, Dec. 1976, 197 pp.

Primary Examiner—Andrew J. James
Assistant Examiner—J. Carroll
Attorney, Agent, or Firm—Joseph E. Szabo; William J. Bethurum; Anthony W. Karambelas

[57] ABSTRACT

A polycrystalline silicon field plate underlies a polycrystalline silicon resistor and is heavily doped so that it is virtually a conductor while an aluminum field plate overlies the polycrystalline silicon resistor. Electrical potentials are applied to the polycrystalline field plate and the aluminum field plate, the potentials being selected so that an electric field is created at the boundary between the polycrystalline semiconductor resistor and the surrounding dielectric layer, the electric field forcing charge carriers in the resistor away from the boundary and toward a central region of the resistor. As a result, surface state noise in the resistor is significantly reduced.

1 Claim, 5 Drawing Figures

POLYCRYSTALLINE SEMICONDUCTOR RESISTOR HAVING A NOISE REDUCING FIELD PLATE

TECHNICAL FIELD

This invention is related to techniques for reducing 1/f noise in polycrystalline silicon resistors used in metal oxide semiconductor (MOS) circuits such as imagers and random access memories.

RELATED APPLICATIONS

This patent application is related to U.S. Patent application Ser. No. 325,441, filed Nov. 27, 1981, by Joseph Y. M. Lee, entitled "Polycrystalline Semiconductor Resistor with Profiled Ion Implantation for Reducing Noise", and assigned to the assignee of the present application.

BACKGROUND ART

A significant advance in metal oxide semiconductor (MOS) technology was the introduction of polycrystalline silicon resistors which are formed in a dielectric layer overlying the silicon substrate. A polycrystalline silicon resistor comprises a strip of polycrystalline silicon formed in the dielectric layer overlying the substrate, the resistivity of the polycrystalline resistor being determined by the concentration of implanted doping impurities. By using ion implantation, the resistivity may be selected with great accuracy, a significant advantage. Furthermore, the polycrystalline resistor does not take up room on the underlying substrate, which improves device density on the integrated circuit.

One problem with polycrystalline silicon resistors is that transmission of a signal through a polycrystalline silicon resistor introduces noise into that signal which is inversely proportional to the frequency. This type of noise is commonly called flicker noise on 1/f noise. It is believed that this noise arises from the presence of surface states at the interface between the polycrystalline silicon resistor and the surrounding dielectric layer. The phenomenon of surface state noise is well known in the art. Polycrystalline silicon germanium has been studied by Chen, "Electrical and Noise Properties of Vacuum Deposited Thin Germanium Films", PhD Thesis, University of South Florida, 1976. Such noise is a significant problem if the polycrystalline semiconductor resistor is to be used as a photodetector load resistor in a charge coupled device imager array, because such noise degrades the quality of the image produced by the imager. Such noise is also a significant problem if the polycrystalline semiconductor resistor is to be used in a semiconductor memory such as a random access memory formed on an integrated circuit substrate, inasmuch as the 1/f noise can introduce errors into the memory. Accordingly, it has been a goal in the art to somehow eliminate or at least reduce 1/f noise in polycrystalline semiconductor resistors.

SUMMARY OF THE INVENTION

In the present invention, 1/f noise in a polycrystalline silicon resistor is reduced by introducing means for confining current flow through the polycrystalline semiconductor resistor in a central region away from the boundaries between the polycrystalline semiconductor resistor and the surrounding dielectric layer. The result is that the charge carriers comprising the current flowing through the resistor do not interact with the surface states at the boundaries between the polycrystalline semiconductor resistor and the surrounding dielectric, thus significantly reducing 1/f noise.

In the present invention, the preferred embodiment includes a polycrystalline semiconductor resistor surrounded by a dielectric layer overlying a semiconductive substrate, the invention further including one or more field plates facing the polycrystalline silicon resistor and formed in different levels in the layer. In one exemplary embodiment, a polycrystalline silicon field plate underlies the polycrystalline silicon resistor and is heavily doped so that it is virtually a conductor while an aluminum field plate overlies the polycrystalline silicon resistor. Electrical potentials are applied to the polycrystalline field plate and the aluminum field plate, the potentials being selected so that an electric field is created at the boundary between the polycrystalline semiconductor resistor and the surrounding dielectric layer, the electric field forcing charge carriers in the resistor away from the boundary and toward a central portion of the resistor.

DESCRIPTION OF THE DRAWINGS

The invention is best understood by reference to the accompanying drawings, of which:

FIG. 2b is a plan view corresponding to FIG. 2a;

FIG. 2c illustrates the implanted dopant density distribution in the resistor corresponding to the cross-sectional view of FIG. 2a.

DETAILED DESCRIPTION OF THE INVENTION

Figure 1:
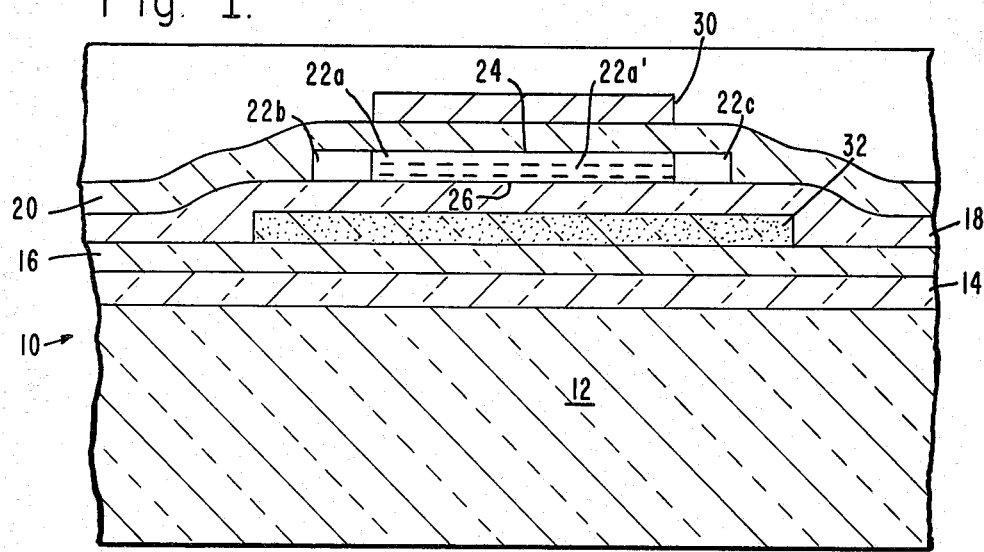
FIG. 1 is a simplified cross-sectional view of an integrated circuit embodying the preferred embodiment of the present invention.

FIG. 1 illustrates an integrated circuit 10 including a semiconductive silicon substrate 12 and overlying dielectric layers 14, 16, 18 and 20 comprising silicon dioxide. A polycrystalline silicon resistor 22 is surrounded by the dielectric layers 18 and 20 and overlies the silicon substrate 12. The resistor 22 is preferably formed by lightly implanting donor-type dopants (for example, arsenic) in a middle resistor portion 22a and heavily implanting donor-type dopants in contact portions 22b, 22c at either end of the resistor 22.

Figure 2B:
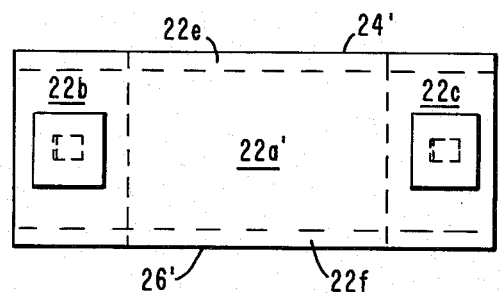
Figure 2D:
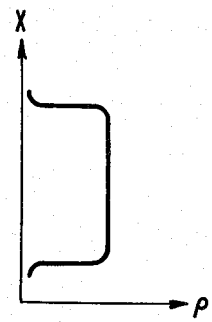
FIG. 2d illustrates the implanted dopant density distribution in the resistor corresponding to the plan view of FIG. 2b.
Figure 2A:
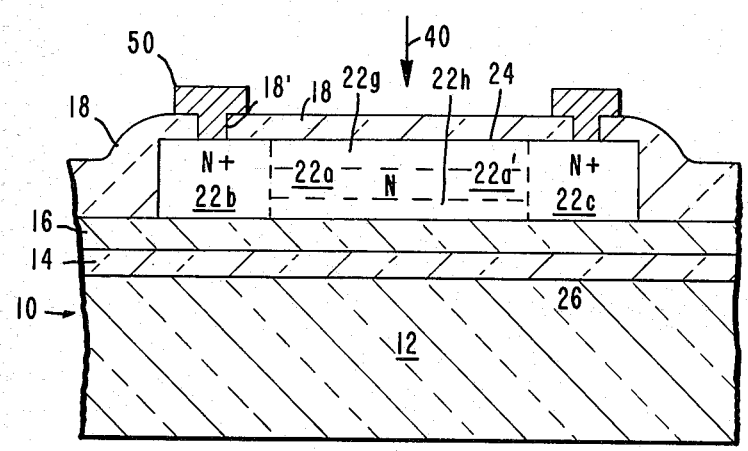
FIG. 2a is a simplified cross-sectional view of an integrated circuit illustrating an alterntive technique for reducing noise in polycrystalline semiconductor resistors using ion implantation, and is the subject of U.S. Patent application Ser. No. 325,441, filed Nov. 27, 1981, by Joseph Y. M. Lee, entitled "Polycyrstalline Semiconductor Resistor with Profiled Ion Implantation for Reducing Noise" and assigned to the assignee of the present application.

FIGS. 2a and 2b in addition to illustrating the subject matter of the above-referenced Lee application, illustrate a conventional feature also included in the present invention wherein the overlying dielectric layer 18 has contact holes 18' formed therein through which metal contacts 50 may be formed to each of the heavily doped contact ends 22b, c of the resistor 22. Electrons introduced at one of the ends 22b, 22c flow through the resistor portion 22a to the opposite end.

The problem with the resistor 22 is that surface states, comprising lattice imperfections or empty atomic sites, are present at the top boundary 24 and the bottom boundary 26 and all other boundaries between the resistor 22 and the surrounding oxide layers 18, 20. Electrons flowing through the resistor 22 interact with the surface states, which introduces noise into the signal represented by the electron current. This noise is inversely proportional to the frequency and is commonly called 1/f noise.

This problem is solved in the present invention by the introduction of a field plate facing the resistor 22, the field plate introducing an electric field near one of the boundaries 24, 26 so that carriers flowing between the two ends 22b, 22c of the resistor 22 are forced away from the boundary. This reduces the electron and surface state interaction and therefore reduces 1/f noise.

One field plate may be an aluminum field plate 30 (FIG. 1) formed over the dielectric layer 20 and overlying the polycrystalline silicon resistor 22. Another field plate may be a polycrystalline silicon field plate 32 formed beneath the resistor 22 between the dielectric layers 16, 18. The polycrystalline field plate 32 is heavily doped with, for example, donor-type impurities using well-known techniques so that the polycrystalline material in the field plate 32 is virtually conductive. If a negative potential is applied to the aluminum field plate 30, an electric field will be created which forces electron carriers in the resistor 22 away from the boundary 24. If a negative potential is applied to the polycrystalline field plate 32, an electric field in the opposite direction will be created which repels electron carriers in the resistor 22 away from the bottom boundary 26.

It is preferable to simultaneously repel electron carriers in the resistor 22 from both boundaries 24, 26 by applying negative potentials to both field plates 30, 32. This causes repulsive electric fields to be present at both boundaries 24, 26 so that electron carriers are driven away from the boundaries 24, 26 and confined to a central region 22a' in the interior of the resistor 22, thus reducing the electron and surface state interaction and therefore reducing the 1/f noise.

An alternative technique for reducing 1/f noise in polycrystalline semiconductor resistors and maintaining carrier flow away from the resistor boundaries is illustrated in FIGS. 2a and 2b and is the subject of the related application identified above filed by Joseph Y. M. Lee. In the device of FIGS. 2a and b, instead of using the field plates 30, 32, the polycrystalline silicon resistor 22 is implanted in such a manner that the peripheral portions 22e, f, g, h near the top and bottom boundaries 24, 26 and side boundaries 24', 26' of the resistor 22 are relatively nonconductive in comparison with the central region 22a'. In order to accomplish this, profiled ion implantation is performed on the polycrystalline silicon resistor 22 to create the vertical distribution of implanted dopants illustrated in FIG. 2c (corresponding to the cross-sectional view of FIG. 2a) and the horizontal distribution of implanted dopants illustrated in FIG. 2d (corresponding to the plan view of FIG. 2b).

Figure 2C:
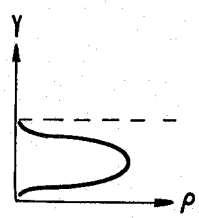

In order to achieve the vertical distribution of implanted dopants illustrated in FIG. 2c, an ion beam 40 comprising dopant ions (such as an acceptor dopant which may be arsenic ions) is directed toward the top boundary 24. The energy of the beam 40 is precisely selected so that the density $p$ of implanted dopant impurities assumes that vertical distribution illustrated in FIG. 2c. This selection, of course, will vary depending upon the particular device geometries involved. Techniques for achieving the distribution illustrated in FIG. 2c are well known in the art of ion implantation and will not be described here. Generally, the peak of the distribution curve illustrated in FIG. 2c should correspond to the vertical center of the central region 22a' of the resistor 22.

The horizontal distribution of dopant impurities illustrated in FIG. 2d is achieved by a suitable mask, such as photoresist, placed over the top surface 24 prior to the ion implantation step of FIG. 2a. The extent of the mask is such that only the central region 22a' is exposed to the implantation beam 40, the peripheral regions 22e, 22f being shielded by the mask. Use of photoresist as an ion implantation mask is a well-known technique in the art and will not be described further herein.

The resistivity of the resistor is inversely proportional to the dopant concentration $p$. Accordingly, the vertical distribution of dopant concentration $p$ of FIG. 2c and the horizontal distribution of FIG. 2d makes the peripheral regions 22e, f, g, h relatively nonconductive while the center region 22a' is relatively conductive and has a resistivity determined by the concentration $p$ of implanted dopants therein. Accordingly, the resistivity of the resistor 22 may be accurately selected, while at the same time 1/f noise may be reduced by the profiled ion implantation characterized by FIGS. 2c and 2d. Most of the electrons flowing between the two contact ends 22b, 22c of the resistor 22 flow only through the central region 22a', so that electron interaction with the surface states present at the vertical boundaries 24, 26 and the side boundaries 24', 26' is significantly reduced. As a result, 1/f noise in the resistor is reduced proportionately.

What is claimed is:

1. A low noise polycrystalline semiconductor resistor, comprising:

a semiconductive substrate including an overlying dielectric layer;

a polycrystalline semiconductor resistor formed in said dielectric layer;

an insulated polycrystalline semiconductor field plate formed in said dielectric layer between said resistor and said substrate;

an insulated field plate overlying said polycrystalline semiconductor resistor; and means for applying like potentials to said field plates suitable to repel charge carriers in said polycrystalline semiconductor resistor away from the upper and lower boundaries between said resistor and said dielectric layer and toward the core of said resistor so as to reduce noise in said polycrystalline semiconductor resistor.

* * * * *